United States Patent
Lee et al.

(10) Patent No.: US 10,430,274 B2
(45) Date of Patent: Oct. 1, 2019

(54) SEMICONDUCTOR DEVICES EXECUTING AN ERROR SCRUB OPERATION

(71) Applicant: SK hynix Inc., Icheon-si Gyeonggi-do (KR)

(72) Inventors: Jae In Lee, Icheon (KR); Yong Mi Kim, Hwaseong (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 96 days.

(21) Appl. No.: 15/715,474

(22) Filed: Sep. 26, 2017

(65) Prior Publication Data

US 2018/0307559 A1   Oct. 25, 2018

(30) Foreign Application Priority Data

Apr. 24, 2017  (KR) .................. 10-2017-0052569

(51) Int. Cl.
   *G06F 11/10* (2006.01)
   *G11C 29/52* (2006.01)
   *G11C 16/26* (2006.01)
   *G11C 29/04* (2006.01)

(52) U.S. Cl.
   CPC ........ *G06F 11/1068* (2013.01); *G06F 11/106* (2013.01); *G11C 29/52* (2013.01); *G11C 16/26* (2013.01); *G11C 2029/0409* (2013.01)

(58) Field of Classification Search
   CPC .... G06F 11/1068; G06F 11/106; G11C 29/52; G11C 2029/0409; G11C 16/26
   See application file for complete search history.

(56) References Cited

U.S. PATENT DOCUMENTS

| | | | | | |
|---|---|---|---|---|---|
| 5,263,032 | A | * | 11/1993 | Porter | G06F 11/106 714/710 |
| 5,987,628 | A | * | 11/1999 | Von Bokern | G06F 11/1048 714/48 |
| 8,032,816 | B2 | * | 10/2011 | Spanel | G06F 11/1012 714/765 |

(Continued)

FOREIGN PATENT DOCUMENTS

KR   1020060135227 A   12/2006

OTHER PUBLICATIONS

H. Michel, A. Belger, T. Lange, B. Fiethe and H. Michalik, "Read back scrubbing for SRAM FPGAs in a data processing unit for space instruments," 2015 NASA/ESA Conference on Adaptive Hardware and Systems (AHS), Montreal, QC, 2015, pp. 1-8.*

(Continued)

*Primary Examiner* — Cynthia Britt
(74) *Attorney, Agent, or Firm* — William Park & Associates Ltd.

(57) ABSTRACT

A semiconductor device includes a flag generation circuit and a write operation circuit. The flag generation circuit generates an error scrub flag if an error scrub operation is performed. The write operation circuit controls a write operation in response to the error scrub flag. The error scrub operation includes an internal read operation for outputting read data from a cell array, a data correction operation for correcting an error included in the read data to generate corrected data, and an internal write operation for storing the corrected data into the cell array.

18 Claims, 15 Drawing Sheets

(56) References Cited

U.S. PATENT DOCUMENTS

| | | | | |
|---|---|---|---|---|
| 8,443,262 | B2* | 5/2013 | Foley | G11C 29/028 |
| | | | | 714/718 |
| 8,640,006 | B2* | 1/2014 | Carman | G06F 11/106 |
| | | | | 714/710 |
| 9,600,362 | B2* | 3/2017 | Kang | G11C 11/40611 |
| 2008/0148108 | A1 | 6/2008 | Barnum et al. | |
| 2010/0332900 | A1* | 12/2010 | Yang | G06F 11/106 |
| | | | | 714/16 |
| 2017/0123903 | A1* | 5/2017 | Eguchi | G11C 29/52 |
| 2017/0161143 | A1* | 6/2017 | Reed | G06F 11/1068 |
| 2017/0242585 | A1* | 8/2017 | Eguchi | G06F 3/061 |
| 2018/0267852 | A1* | 9/2018 | Kwon | G06F 11/1068 |

OTHER PUBLICATIONS

T. Boraten and A. Kodi, "Energy-efficient Runtime Adaptive Scrubbing in fault-tolerant Network-on-Chips (NoCs) architectures," 2013 IEEE 31st International Conference on Computer Design (ICCD), Asheville, NC, 2013, pp. 264-271.*

R. Santos, S. Venkataraman and A. Kumar, "Generic scrubbing-based architecture for custom error correction algorithms," 2015 International Symposium on Rapid System Prototyping (RSP), Amsterdam, 2015, pp. 112-118.*

* cited by examiner

23

512

SEMICONDUCTOR DEVICES EXECUTING AN ERROR SCRUB OPERATION

CROSS-REFERENCE TO RELATED APPLICATIONS

The present application claims priority under 35 U.S.C 119(a) to Korean Application No. 10-2017-0052569, filed on Apr. 24, 2017, which is incorporated herein by reference in its entirety.

BACKGROUND

1. Technical Field

Embodiments of the present disclosure relate to semiconductor devices executing an error scrub operation.

2. Related Art

Recently, a DDR2 scheme and a DDR3 scheme receiving and outputting four-bit data or eight-bit data during each clock cycle time has been used to improve operation speeds of semiconductor devices. If a data transmission speed of the semiconductor devices becomes faster, a probability of errors occurring may increase while data is transmitted in the semiconductor device. Accordingly, novel design schemes have been proposed to improve the reliability of the data transmission.

Whenever data is transmitted in semiconductor devices, error codes which are capable of detecting the occurrence of errors may be generated and transmitted with the data to improve the reliability of the data transmission. The error codes may include an error detection code (EDC) which is capable of detecting errors, and an error correction code (ECC) which is capable of correcting the errors by itself.

SUMMARY

According to an embodiment, a semiconductor device includes a flag generation circuit and a write operation circuit. The flag generation circuit generates an error scrub flag if an error scrub operation is performed. The write operation circuit controls a write operation in response to the error scrub flag. The error scrub operation includes an internal read operation for outputting read data from a cell array, a data correction operation for correcting an error included in the read data to generate corrected data, and an internal write operation for storing the corrected data into the cell array.

According to another embodiment, a semiconductor device includes an error scrub control circuit and a write operation circuit. The error scrub control circuit controls an error scrub operation in response to an error scrub command. The write operation circuit controls a write operation if the error scrub operation is performed. The error scrub operation includes an internal read operation for outputting read data from a cell array, a data correction operation for correcting an error included in the read data to generate corrected data, and an internal write operation for storing the corrected data into the cell array.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Various embodiments of the present disclosure will be described hereinafter with reference to the accompanying drawings. However, the embodiments described herein are for illustrative purposes only and are not intended to limit the scope of the present disclosure.

Figure 1:
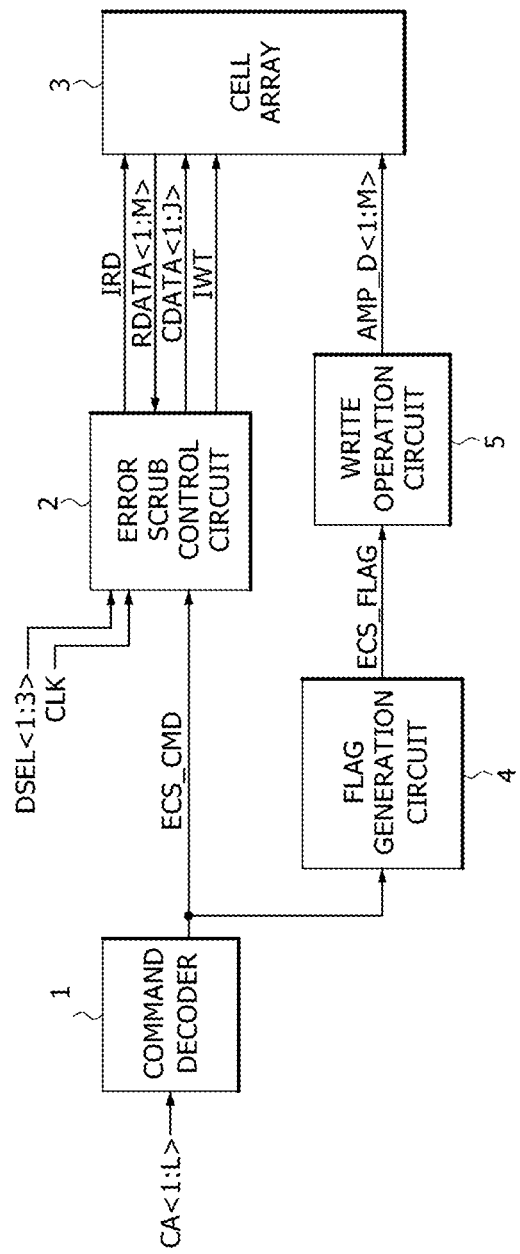
FIG. 1 is a block diagram illustrating a configuration of a semiconductor device according to an embodiment of the present disclosure.

As illustrated in FIG. 1, a semiconductor device according to an embodiment may include a command decoder 1, an error scrub control circuit 2, a cell array 3, a flag generation circuit 4, and a write operation circuit 5.

The command decoder 1 may generate an error scrub command ECS_CMD in response to an external control signal CA<1:L>. The external control signal CA<1:L> may include at least one of a command and an address. The command decoder 1 may decode the command included in the external control signal CA<1:L> to generate the error scrub command ESC_CMD. The number "L" of bits included in the external control signal CA<1:L> may be set to be different according to the embodiment.

The error scrub control circuit 2 may control an error scrub operation in response to at least one of the error scrub command ESC_CMD, a clock signal CLK, and a delay selection signal DSEL<1:3>. The error scrub operation may be performed by sequentially executing an internal read operation, a data correction operation, and an internal write operation. The error scrub control circuit 2 may generate an internal read signal IRD in response to the error scrub command ESC_CMD, the clock signal CLK, and the delay selection signal DSEL<1:3>. The error scrub control circuit 2 may generate the internal read signal IRD which is enabled to execute the internal read operation at time that a delay time set by the clock signal CLK and the delay selection signal DSEL<1:3> elapses from a time that the error scrub command ESC_CMD is created. The error scrub control circuit 2 may receive read data RDATA<1:M> from the cell array 3 during the internal read operation. The error scrub control circuit 2 may correct an error included in the read data RDATA<1:M> during the data correction operation to generate corrected data CDATA<1:J>. The error scrub control circuit 2 may correct the error included in the read data RDATA<1:M> using an error correction code (ECC) scheme. The error scrub control circuit 2 may generate an internal write signal IWT which is enabled to perform the internal write operation after the internal read operation and the data correction operation terminate. The error scrub control circuit 2 may store the corrected data CDATA<1:J> into the cell array 3 during the internal write operation.

The cell array 3 may output the read data RDATA<1:M> or may receive the corrected data CDATA<1:J> to store therein, in response to the internal read signal IRD and the internal write signal IWT. The cell array 3 may output the read data RDATA<1:M> stored therein if the internal read signal IRD is enabled. The cell array 3 may receive and store the corrected data CDATA<1:J> therein if the internal write signal IWT is enabled. The number "M" of bits included in the read data RDATA<1:M> and the number "J" of bits included in the corrected data CDATA<1:J> may be set to be different according to the embodiment.

The flag generation circuit 4 may generate an error scrub flag ECS_FLAG in response to the error scrub command ESC_CMD. The flag generation circuit 4 may generate the error scrub flag ECS_FLAG which is enabled if the error scrub command ESC_CMD is created. In other words, the flag generation circuit 4 may generate the error scrub flag ECS_FLAG if an error scrub operation is performed.

The write operation circuit 5 may control the write operation in response to the error scrub flag ECS_FLAG. In other words, the write operation circuit 5 may control the write operation if the error scrub operation is performed. The write operation circuit 5 may receive data (DATA of FIG. 8) in synchronization with a data strobe signal (DQS of FIG. 8) to perform a write operation for generating amplified data AMP_D<1:M> which is stored into the cell array 3. The write operation circuit 5 may interrupt the write operation if the error scrub flag ECS_FLAG is enabled.

Figure 2:
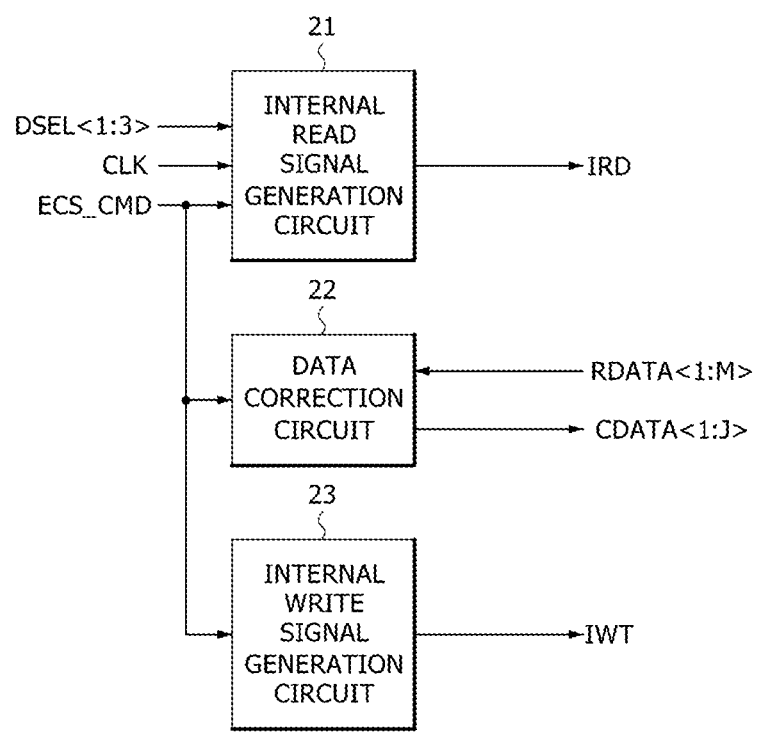
FIG. 2 is a block diagram illustrating an example of an error scrub control circuit included in the semiconductor device of FIG. 1.

Referring to FIG. 2, the error scrub control circuit 2 may include an internal read signal generation circuit 21, a data correction circuit 22, and an internal write signal generation circuit 23.

The internal read signal generation circuit 21 may generate the internal read signal IRD from the error scrub command ESC_CMD in response to the error scrub command ESC_CMD, the clock signal CLK, and the delay selection signal DSEL<1:3>. The internal read signal generation circuit 21 may delay the error scrub command ESC_CMD by a predetermined delay time, which is set according to a logic level combination of the delay selection signal DSEL<1:3>, in synchronization with the clock signal CLK to generate the internal read signal IRD. The internal read signal IRD may be enabled at a time that the predetermined delay time set by a logic level combination of the delay selection signal DSEL<1:3> elapses from a time that the error scrub command ESC_CMD is created. In some embodiments, the predetermined delay time of the internal read signal generation circuit 21 may be set by some of bits included in the delay selection signal DSEL<1:3>. A configuration and an operation of the internal read signal generation circuit 21 will be described more fully with reference to FIGS. 3 to 5 later.

The data correction circuit 22 may generate the corrected data CDATA<1:J> from the read data RDATA<1:M> in response to the error scrub command ESC_CMD. The data correction circuit 22 may correct an error included in the read data RDATA<1:M> to generate the corrected data CDATA<1:J> if the error scrub command ESC_CMD is created. The data correction circuit 22 may generate the corrected data CDATA<1:J> from the read data RDATA<1:M> using an error correction code (ECC) scheme. The data correction circuit 22 may generate the corrected data CDATA<1:J> using a parity and a syndrome which are generated from the read data RDATA<1:M>.

The internal write signal generation circuit 23 may generate the internal write signal IWT in response to the error scrub command ESC_CMD. The internal write signal generation circuit 23 may generate the internal write signal IWT which is enabled at a time that a predetermined delay time elapses from a time that the error scrub command ESC_CMD is created. The predetermined delay time of the internal write signal generation circuit 23 may be set so that the internal write signal IWT is enabled after the corrected data CDATA<1:J> is generated by correcting errors included in the read data RDATA<1:M> outputted from the cell array 3 during the internal read operation which is executed if the internal read signal IRD is enabled.

Figure 3:
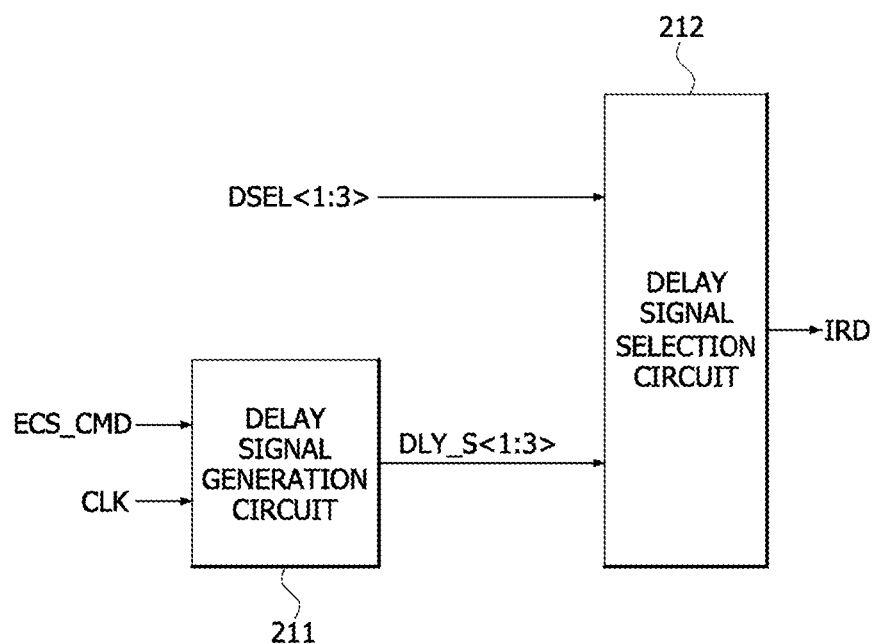
FIG. 3 is a block diagram illustrating an example of an internal read signal generation circuit included in the error scrub control circuit of FIG. 2.

Referring to FIG. 3, the internal read signal generation circuit 21 may include a delay signal generation circuit 211 and a delay signal selection circuit 212.

The delay signal generation circuit 211 may generate first to third delay signals DLY_S<1:3> from the error scrub command ESC_CMD in response to the clock signal CLK. The delay signal generation circuit 211 may shift and sequentially delay the error scrub command ESC_CMD in synchronization with the clock signal CLK to generate the first to third delay signals DLY_S<1:3>.

The delay signal selection circuit 212 may generate the internal read signal IRD from the first to third delay signals DLY_S<1:3> in response to the delay selection signal DSEL<1:3>. The delay signal selection circuit 212 may output the first delay signal DLY_S<1> as the internal read signal IRD if the first delay selection signal DSEL<1> is enabled. The delay signal selection circuit 212 may output the second delay signal DLY_S<2> as the internal read signal IRD if the second delay selection signal DSEL<2> is enabled. The delay signal selection circuit 212 may output the third delay signal DLY_S<3> as the internal read signal IRD if the third delay selection signal DSEL<3> is enabled.

Figure 4:
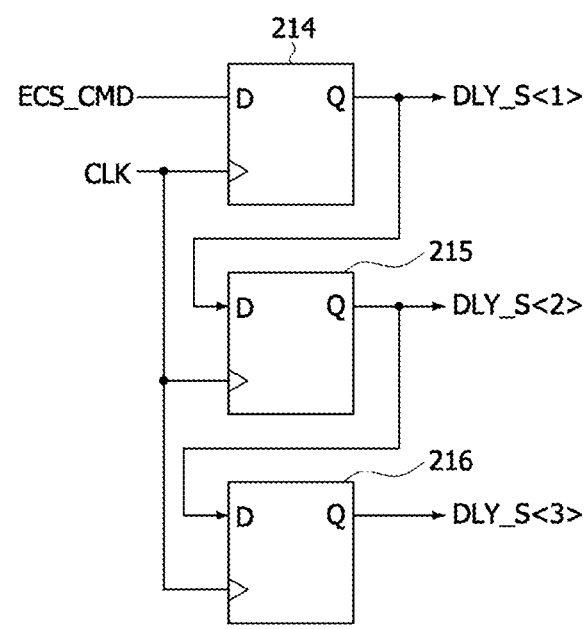
FIG. 4 is a circuit diagram illustrating an example of a delay signal generation circuit included in the internal read signal generation circuit of FIG. 3.

Referring to FIG. 4, the delay signal generation circuit 211 may include a first delay circuit 214, a second delay circuit 215, and a third delay circuit 216. The first, second, and third delay circuits 214, 215, and 216 may be realized using flip-flops. The first delay circuit 214 may delay the error scrub command ESC_CMD in synchronization with the clock signal CLK to output the delayed error scrub command as the first delay signal DLY_S<1>. The second delay circuit 215 may delay the first delay signal DLY_S<1> in synchronization with the clock signal CLK to output the delayed first delay signal as the second delay signal DLY_S<2>. The third delay circuit 216 may delay the second delay signal DLY_S<2> in synchronization with the clock signal CLK to output the delayed second delay signal as the third delay signal DLY_S<3>.

Figure 5:
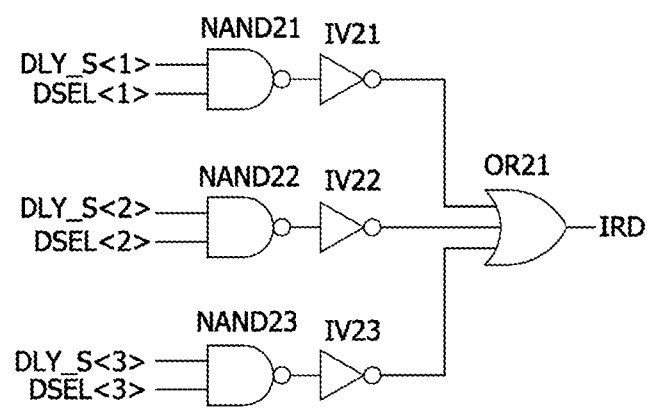
FIG. 5 is a circuit diagram illustrating an example of a delay signal selection circuit included in the internal read signal generation circuit of FIG. 3.

Referring to FIG. 5, the delay signal selection circuit 212 may include NAND gates NAND21, NAND22, and NAND23, inverters IV21, IV22, and IV23, and an OR gate OR21. The delay signal selection circuit 212 may output the first delay signal DLY_S<1> as the internal read signal IRD through the NAND gate NAND21, the inverter IV21, and the OR gate OR21 if the first delay selection signal DSEL<1> is enabled. The delay signal selection circuit 212 may output the second delay signal DLY_S<2> as the internal read signal IRD through the NAND gate NAND22, the inverter IV22, and the OR gate OR21 if the second delay selection signal DSEL<2> is enabled. The delay signal selection circuit 212 may output the third delay signal DLY_S<3> as the internal read signal IRD through the NAND gate NAND23, the inverter IV23, and the OR gate OR21 if the third delay selection signal DSEL<3> is enabled.

Figure 6:
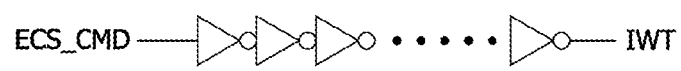
FIG. 6 is a circuit diagram illustrating an example of an internal write signal generation circuit included in the error scrub control circuit of FIG. 2.

Referring to FIG. 6, the internal write signal generation circuit 23 may be realized using an inverter chain circuit. The internal write signal generation circuit 23 may generate the internal write signal IWT which is enabled at time that a predetermined delay time elapses from a time that the error scrub command ESC_CMD is created. The predetermined delay time of the internal write signal generation circuit 23 may be set so that the internal write signal IWT is enabled after the corrected data CDATA<1:J> is generated by correcting errors included in the read data RDATA<1:M> outputted from the cell array 3 during the internal read operation which is executed if the internal read signal IRD is enabled.

Figure 7:
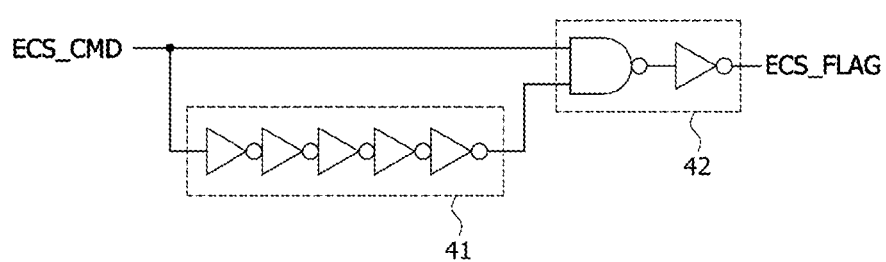
FIG. 7 is a circuit diagram illustrating an example of a flag generation circuit included in the semiconductor device of FIG. 1.

Referring to FIG. 7, the flag generation circuit 4 may include an inversion/delay circuit 41 and a flag output circuit 42. The inversion/delay circuit 41 may be realized to include an odd number of inverters which are coupled in series. The inversion/delay circuit 41 may inversely delay the error scrub command ESC_CMD. The flag output circuit 42 may perform a logical AND operation of the error scrub command ESC_CMD and an output signal of the inversion/delay circuit 41 to generate the error scrub flag ECS_FLAG. The flag generation circuit 4 may generate the error scrub flag ECS_FLAG which is enabled if the error scrub command ESC_CMD is created.

Figure 8:
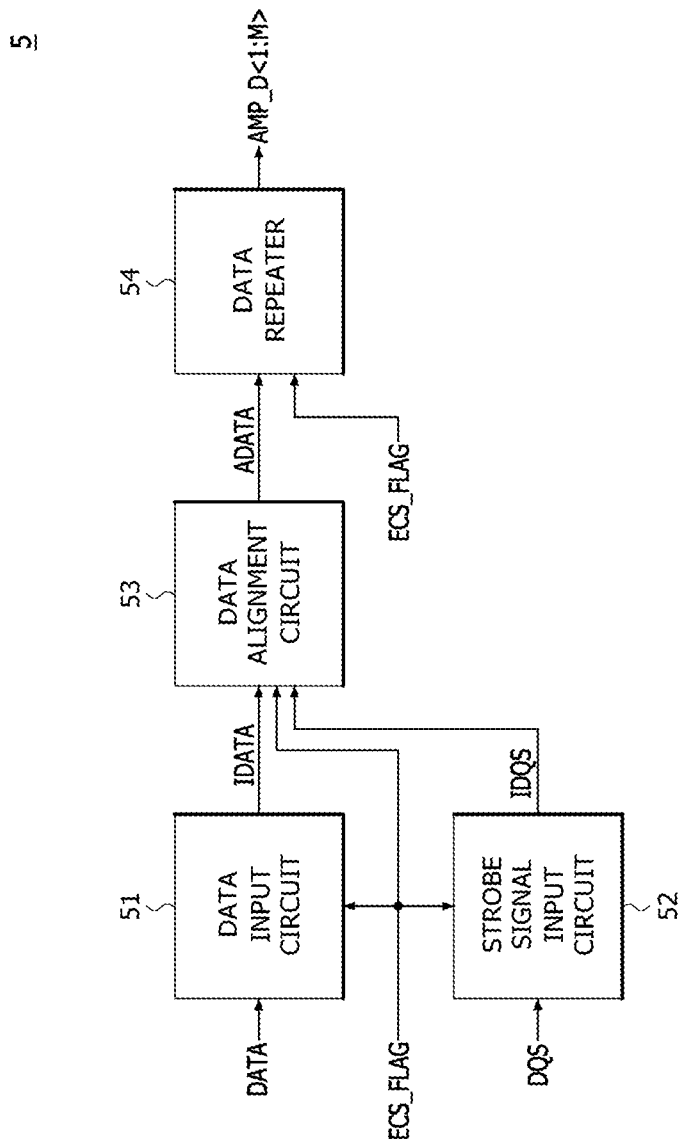
FIG. 8 is a block diagram illustrating an example of a write operation circuit included in the semiconductor device of FIG. 1.

Referring to FIG. 8, the write operation circuit 5 may include a data input circuit 51, a strobe signal input circuit 52, a data alignment circuit 53, and a data repeater 54.

The data input circuit 51 may generate internal data IDATA from the data DATA in response to the error scrub flag ECS_FLAG. The data input circuit 51 may buffer and delay the data DATA to generate the internal data IDATA while the error scrub flag ECS_FLAG is disabled. The data input circuit 51 may terminate an operation for generating the internal data IDATA while the error scrub flag ECS_FLAG is enabled. In other words, the data input circuit 51 may interrupt an operation for generating internal data IDATA if the error scrub operation is performed.

The strobe signal input circuit 52 may generate an internal data strobe signal IDQS from the data strobe signal DQS in response to the error scrub flag ECS_FLAG. The strobe signal input circuit 52 may buffer and delay the data strobe signal DQS to generate the internal data strobe signal IDQS while the error scrub flag ECS_FLAG is disabled. The strobe signal input circuit 52 may terminate an operation for generating the internal data strobe signal IDQS while the error scrub flag ECS_FLAG is enabled. In other words, the strobe signal input circuit 52 may terminate generating the internal data strobe signal IDQS if the error scrub operation is performed.

The data alignment circuit 53 may generate aligned data ADATA from the internal data IDATA in response to at least one of the error scrub flag ECS_FLAG and the internal data strobe signal IDQS. The data alignment circuit 53 may align the internal data IDATA according to the internal data strobe signal IDQS to generate the aligned data ADATA while the error scrub flag ECS_FLAG is disabled. The data alignment circuit 53 may terminate an operation for generating the aligned data ADATA while the error scrub flag ECS_FLAG is enabled. In other words, the data alignment circuit 53 may terminate generating the aligned data ADATA if the error scrub operation is performed.

The data repeater 54 may generate the amplified data AMP_D<1:M> from the aligned data ADATA in response to the error scrub flag ECS_FLAG. The data repeater 54 may amplify the aligned data ADATA to generate the amplified data AMP_D<1:M> while the error scrub flag ECS_FLAG is disabled. The data repeater 54 may terminate an operation for generating the amplified data AMP_D<1:M> while the error scrub flag ECS_FLAG is enabled. In other words, the data repeater 54 may terminate generating the amplified data AMP_D<1:M> if the error scrub operation is performed.

Figure 9:
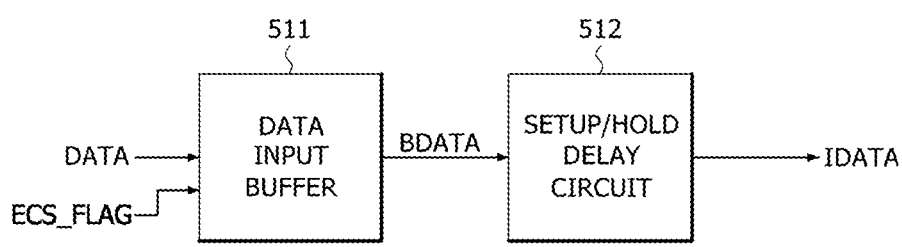
FIG. 9 is a block diagram illustrating an example of a data input circuit included in the write operation circuit of FIG. 8.

Referring to FIG. 9, the data input circuit 51 may include a data input buffer 511 and a setup/hold delay circuit 512. The data input buffer 511 may generate buffered data BDATA from the data DATA in response to the error scrub flag ECS_FLAG. The data input buffer 511 may buffer the data DATA to generate the buffered data BDATA while the error scrub flag ECS_FLAG is disabled. The data input buffer 511 may terminate an operation for generating the buffered data BDATA while the error scrub flag ECS_FLAG is enabled. The setup/hold delay circuit 512 may be realized using an inverter chain circuit. The setup/hold delay circuit 512 may delay the buffered data BDATA by a delay time for setting a predetermined setup time and a predetermined hold time to generate the internal data IDATA.

Figure 10:
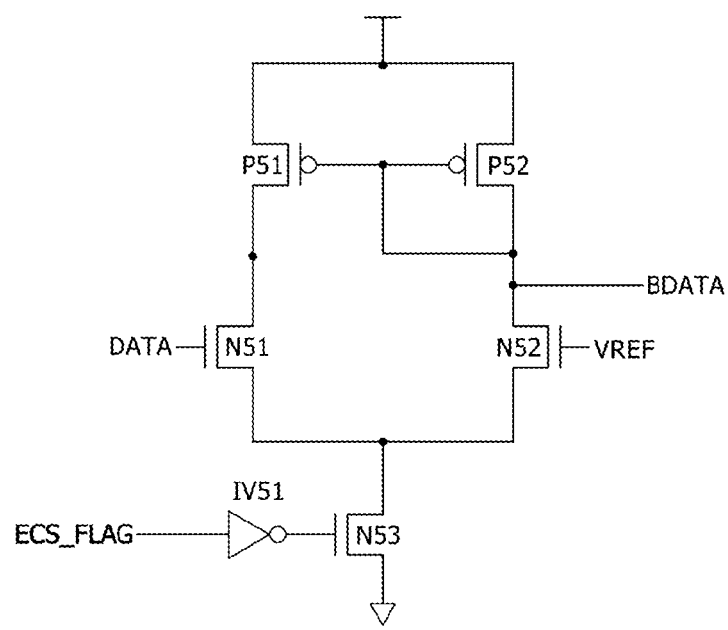
FIG. 10 is a circuit diagram illustrating an example of a data input buffer included in the data input circuit of FIG. 9.

Referring to FIG. 10, the data input buffer 511 may be realized using a differential amplification circuit. The data input buffer 511 may include PMOS transistors P51 and P52, NMOS transistors N51, N52, and N53, and an inverter IV51. The data input buffer 511 may amplify the data DATA to generate the buffered data BDATA while the error scrub flag ECS_FLAG is disabled to have a logic "low" level. The data input buffer 511 may terminate an operation for amplifying the data DATA to generate the buffered data BDATA while the error scrub flag ECS_FLAG is enabled to have a logic "high" level.

Figure 11:
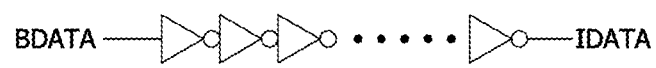
FIG. 11 is a circuit diagram illustrating an example of a setup/hold delay circuit included in the data input circuit of FIG. 9.

Referring to FIG. 11, the setup/hold delay circuit 512 may be realized using an inverter chain circuit. The setup/hold delay circuit 512 may delay the buffered data BDATA by a delay time for setting a predetermined setup time and a predetermined hold time to generate the internal data IDATA.

Figure 12:
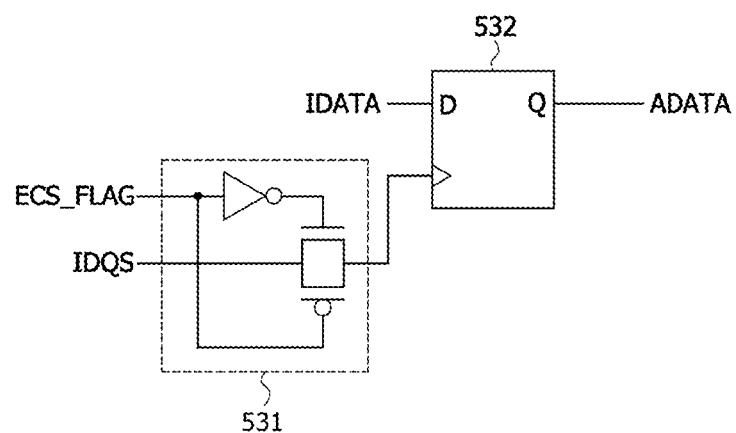
FIG. 12 is a circuit diagram illustrating an example of a data alignment circuit included in the write operation circuit of FIG. 8.

Referring to FIG. 12, the data alignment circuit 53 may be configured to include a strobe signal transmitter 531 and a flip-flop 532. The strobe signal transmitter 531 may output the internal data strobe signal IDQS as an output signal thereof while the error scrub flag ECS_FLAG is disabled to have a logic "low" level. The strobe signal transmitter 531 may terminate an operation for outputting the internal data strobe signal IDQS as an output signal thereof while the error scrub flag ECS_FLAG is enabled to have a logic "high" level. The flip-flop 532 may align the internal data IDATA in synchronization with the internal data strobe signal IDQS to generate the aligned data ADATA if the internal data strobe signal IDQS is transmitted and outputted through the strobe signal transmitter 531.

Figure 13:
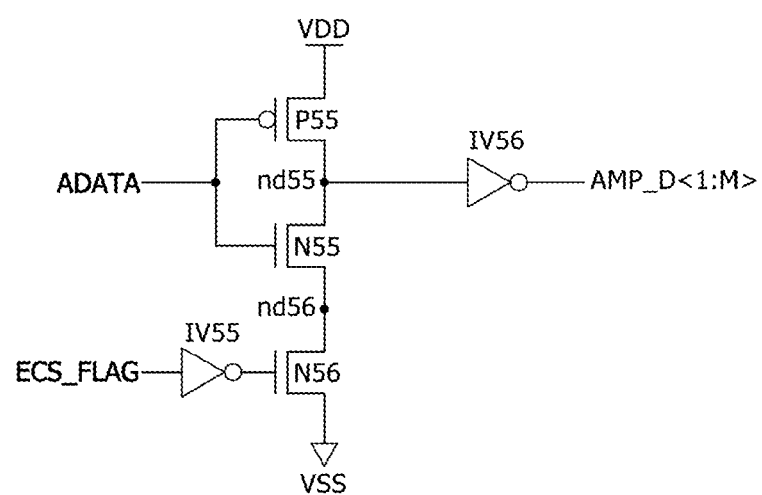
FIG. 13 is a circuit diagram illustrating an example of a data repeater included in the write operation circuit of FIG. 8.

Referring to FIG. 13, the data repeater 54 may include a PMOS transistor P55, NMOS transistors N55 and N56, and inverters IV55 and IV56. The PMOS transistor P55 may be coupled between a power supply voltage VDD terminal and a node nd55 to drive a level of the node nd55 to the power supply voltage VDD in response to the aligned data ADATA. The NMOS transistor N55 may be coupled between the node nd55 and a node nd56 and may be turned on in response to the aligned data ADATA. The NMOS transistor N56 may be coupled between the node nd56 and a ground voltage VSS terminal to drive a level of the node nd56 to the ground voltage VSS in response to the error scrub flag ECS_FLAG. The inverter IV55 may inversely buffer the error scrub flag ECS_FLAG to apply the inversely buffered error scrub flag to a gate of the NMOS transistor N56. The inverter IV56 may inversely buffer a signal of the node nd55 to output the inversely buffered signal as the amplified data AMP_D<1:M>.

As described above, a semiconductor device according to an embodiment may interrupt a write operation in which external data is inputted into the semiconductor device while an error scrub operation is performed, thereby reducing unnecessary power consumption and improving the stability and reliability of the error scrub operation.

Figure 14:
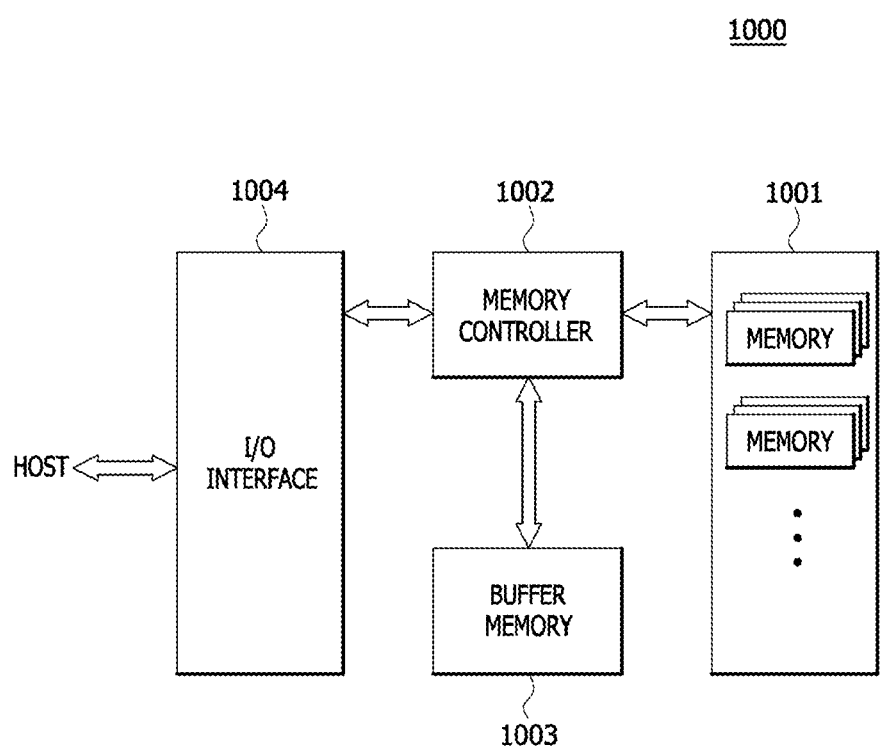
FIG. 14 is a block diagram illustrating a configuration of an electronic system employing the semiconductor device shown in FIGS. 1 to 13.

The semiconductor device described with reference to FIGS. 1 to 13 may be applied to an electronic system that includes a memory system, a graphic system, a computing system, a mobile system, or the like. For example, as illustrated in FIG. 14, an electronic system 1000 according an embodiment may include a data storage circuit 1001, a memory controller 1002, a buffer memory 1003, and an input/output (I/O) interface 1004.

The data storage circuit 1001 may store data which is outputted from the memory controller 1002 or may read and output the stored data to the memory controller 1002, according to a control signal outputted from the memory controller 1002. The data storage circuit 1001 may include the semiconductor device illustrated in FIG. 1. Meanwhile, the data storage circuit 1001 may include a nonvolatile memory that can retain its stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 14 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which is processed by the memory controller 1002. That is, the buffer memory 1003 may temporarily store the data which is outputted from or inputted to the data storage circuit 1001. The buffer memory 1003 may store the data, which is outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data outputted from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI), and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

Figure 15:
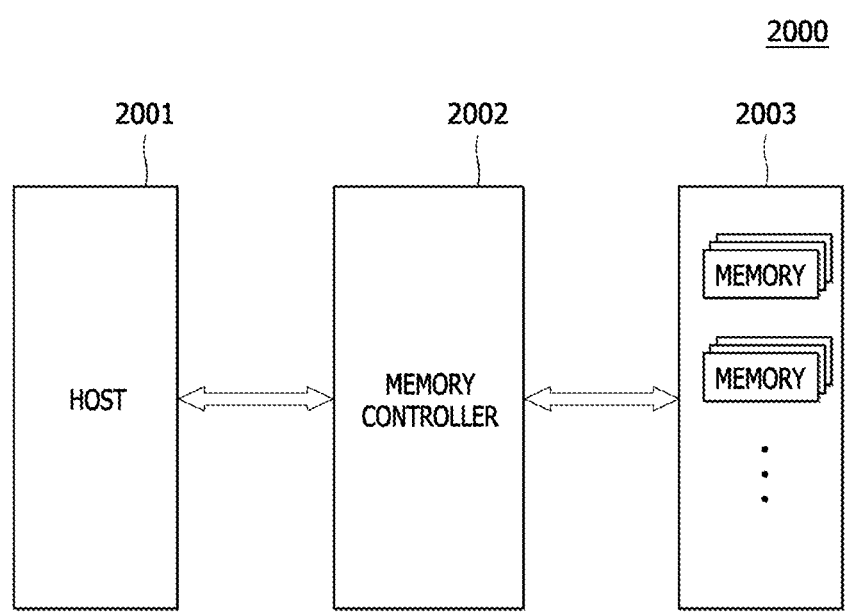
FIG. 15 is a block diagram illustrating a configuration of another electronic system employing the semiconductor device shown in FIGS. 1 to 13.

Referring to FIG. 15, an electronic system 2000 according another embodiment may include a host 2001, a memory controller 2002, and a data storage circuit 2003.

The host 2001 may output a request signal and data to the memory controller 2002 to access to the data storage circuit 2003. The memory controller 2002 may supply the data, a data strobe signal, a command, an address, and a clock signal to the data storage circuit 2003 in response to the request signal, and the data storage circuit 2003 may execute a write operation or a read operation in response to the command. The host 2001 may transmit the data to the memory controller 2002 to store the data into the data storage circuit 2003. In addition, the host 2001 may receive the data outputted from the data storage circuit 2003 through the memory controller 2002. The host 2001 may include a circuit that corrects errors of the data using an error correction code (ECC) scheme.

The memory controller 2002 may act as an interface that connects the host 2001 to the data storage circuit 2003 for communication between the host 2001 and the data storage circuit 2003. The memory controller 2002 may receive the request signal and the data from the host 2001 and may generate and supply the data, the data strobe signal, the command, the address and the clock signal to the data storage circuit 2003 in order to control operations of the data storage circuit 2003. In addition, the memory controller 2002 may supply the data outputted from the data storage circuit 2003 to the host 2001.

The data storage circuit 2003 may include a plurality of memories. The data storage circuit 2003 may receive the data, the data strobe signal, the command, the address and the clock signal from the memory controller 2002 to execute the write operation or the read operation. Each of the memories included in the data storage circuit 2003 may include a circuit that corrects errors of the data using an error correction code (ECC) scheme. The data storage circuit 2003 may include the semiconductor device illustrated in FIG. 1.

In some embodiments, the electronic system 2000 may be realized to selectively operate any one of the ECC circuits included in the host 2001 and the data storage circuit 2003. Alternatively, the electronic system 2000 may be realized to simultaneously operate all of the ECC circuits included in the host 2001 and the data storage circuit 2003. The host 2001 and the memory controller 2002 may be realized in a single chip according to some embodiments. The memory controller 2002 and the data storage circuit 2003 may be realized in a single chip according to some embodiments.

What is claimed is:

1. A semiconductor device comprising:
   a flag generation circuit configured to generate an error scrub flag when an error scrub operation is performed; and
   a write operation circuit configured to control a write operation in response to the error scrub flag,
   wherein the error scrub operation includes an internal read operation for outputting read data from a cell array, a data correction operation for correcting an error included in the read data to generate corrected data, and an internal write operation for storing the corrected data into the cell array,
   wherein the write operation circuit includes a data repeater configured to generate amplified data from aligned data in response to the error scrub flag, and
   wherein the data repeater terminates generating the amplified data when the error scrub operation is performed.

2. The semiconductor device of claim 1, wherein the error scrub operation is performed according to an error scrub command which is generated by decoding an external control signal.

3. The semiconductor device of claim 1,
   wherein the write operation circuit includes a data input circuit configured to generate internal data from data in response to the error scrub flag; and
   wherein the data input circuit interrupts an operation for generating the internal data when the error scrub operation is performed.

4. The semiconductor device of claim 3, wherein the data input circuit includes:
   a data input buffer configured to buffer the data to generate buffered data in response to the error scrub flag; and
   a setup/hold delay circuit configured to delay the buffered data to generate the internal data.

5. The semiconductor device of claim 1,
   wherein the write operation circuit includes a strobe signal input circuit configured to generate an internal data strobe signal from a data strobe signal in response to the error scrub flag; and
   wherein the strobe signal input circuit terminates generating the internal data strobe signal when the error scrub operation is performed.

6. The semiconductor device of claim 1,
   wherein the write operation circuit includes a data alignment circuit configured to generate aligned data from internal data in response to the error scrub flag; and
   wherein the data alignment circuit terminates generating the aligned data when the error scrub operation is performed.

7. The semiconductor device of claim 1, further comprising an error scrub control circuit configured to control the error scrub operation in response to an error scrub command.

8. The semiconductor device of claim 7, wherein the error scrub control circuit includes an internal read signal generation circuit configured to generate an internal read signal for performing the internal read operation in response to the error scrub command, a clock signal, and a delay selection signal.

9. The semiconductor device of claim 8, wherein the internal read signal generation circuit includes:
   a delay signal generation circuit configured to shift the error scrub command in synchronization with the clock signal to generate a first delay signal and a second delay signal; and
   a delay signal selection circuit configured to select the first or second delay signal as the internal read signal in response to the delay selection signal.

10. The semiconductor device of claim 7, wherein the error scrub control circuit includes a data correction circuit configured to correct an error included in the read data to generate the corrected data in response to the error scrub command.

11. The semiconductor device of claim 7,
    wherein the error scrub control circuit includes an internal write signal generation circuit configured to generate an internal write signal for performing the internal write operation in response to the error scrub command; and
    wherein the internal write signal is enabled later than an internal read signal for performing the internal read operation.

12. A semiconductor device comprising:
    an error scrub control circuit configured to control an error scrub operation in response to an error scrub command; and
    a write operation circuit configured to control a write operation when the error scrub operation is performed,
    wherein the error scrub operation includes an internal read operation for outputting read data from a cell array, a data correction operation for correcting an error included in the read data to generate corrected data, and an internal write operation for storing the corrected data into the cell array,
    wherein the write operation circuit includes a data repeater configured to generate amplified data from aligned data in response to the error scrub command; and
    wherein the data repeater terminates generating the amplified data when the error scrub operation is performed.

13. The semiconductor device of claim 12, wherein the error scrub control circuit includes an internal read signal generation circuit configured to generate an internal read signal for performing the internal read operation in response to the error scrub command, a clock signal, and a delay selection signal.

14. The semiconductor device of claim 12, wherein the error scrub control circuit includes a data correction circuit configured to correct an error included in the read data to generate the corrected data in response to the error scrub command.

15. The semiconductor device of claim 12,
    wherein the error scrub control circuit includes an internal write signal generation circuit configured to generate an internal write signal for performing the internal write operation in response to the error scrub command; and wherein the internal write signal is enabled later than an internal read signal for performing the internal read operation.

16. The semiconductor device of claim 12,
wherein the write operation circuit includes a data input circuit configured to generate internal data from data in response to the error scrub command; and
wherein the data input circuit interrupts an operation for generating the internal data when the error scrub operation is performed.

17. The semiconductor device of claim 12,
wherein the write operation circuit includes a strobe signal input circuit configured to generate an internal data strobe signal from a data strobe signal in response to the error scrub flag; and
wherein the strobe signal input circuit terminates generating the internal data strobe signal when the error scrub operation is performed.

18. The semiconductor device of claim 12,
wherein the write operation circuit includes a data alignment circuit configured to generate aligned data from internal data in response to the error scrub flag; and
wherein the data alignment circuit terminates generating the aligned data when the error scrub operation is performed.

* * * * *